United States Patent
Wolters et al.

(10) Patent No.: US 7,173,323 B2
(45) Date of Patent: Feb. 6, 2007

(54) SEMICONDUCTOR DEVICE WITH A PROTECTIVE SECURITY COATING COMPRISING MULTIPLE ALTERNATING METAL LAYERS

(75) Inventors: Robertus Adrianus Maria Wolters, Eindhoven (NL); Petra Elisabeth De Jongh, Eindhoven (NL); Ronald Dekker, Eindhoven (NL)

(73) Assignee: MXP B.V. (NL)

( * ) Notice: Subject to any disclaimer, the term of this patent is extended or adjusted under 35 U.S.C. 154(b) by 0 days.

(21) Appl. No.: 10/508,745

(22) PCT Filed: Mar. 20, 2003

(86) PCT No.: PCT/IB03/01025

§ 371 (c)(1),
(2), (4) Date: Sep. 21, 2004

(87) PCT Pub. No.: WO03/081668

PCT Pub. Date: Oct. 2, 2003

(65) Prior Publication Data

US 2005/0140003 A1    Jun. 30, 2005

(30) Foreign Application Priority Data

Mar. 21, 2002   (EP)   .................. 02076112

(51) Int. Cl.
*H01L 23/06*  (2006.01)

(52) U.S. Cl. ...................... 257/679; 257/922
(58) Field of Classification Search ............ 257/679, 257/922
See application file for complete search history.

(56) References Cited

U.S. PATENT DOCUMENTS 6,137,173 A * 10/2000 Davis .......................... 257/730
6,144,106 A * 11/2000 Bearinger et al. .......... 257/789

FOREIGN PATENT DOCUMENTS

JP            60-170239        *  9/1985

* cited by examiner

*Primary Examiner*—Douglas W. Owens
*Assistant Examiner*—Andrew O. Arena
(74) *Attorney, Agent, or Firm*—Peter Zawilski

(57) ABSTRACT

The semiconductor device comprises a substrate (10) with a first (1) and an opposed second side (2), at which first side a plurality of transistors and interconnects is present, which are covered by a protective security covering (16), which device is further provided with bond pad regions (14). The protective security covering (16) comprises a substantially non-transparent and substantially chemically inert security coating (16), and the bond pad regions (14) are accessible from the second side of the substrate (10). The semiconductor device can be suitable made with a substrate transfer technique, in which a second substrate (24) is provided at the protective security covering (16).

9 Claims, 2 Drawing Sheets

Figure 1:
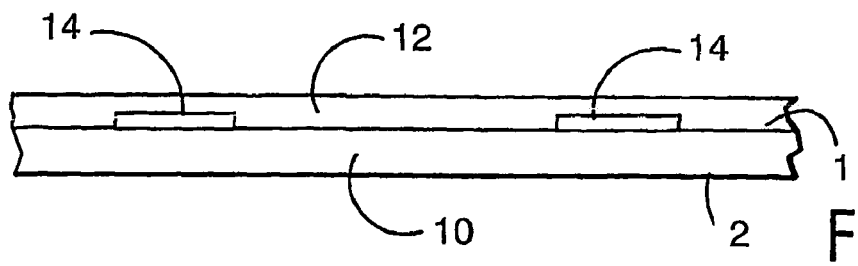

SEMICONDUCTOR DEVICE WITH A PROTECTIVE SECURITY COATING COMPRISING MULTIPLE ALTERNATING METAL LAYERS

The invention relates to a semiconductor device comprising a substrate with a first side, at which first side a plurality of transistors and interconnects is present, which are covered by a protective security covering, which device is further provided with bond pad regions.

The invention also relates to a carrier comprising a semiconductor device.

The invention further relates to a method of manufacturing a semiconductor device provided with a substrate with a first side, comprising the steps of:
  providing a structure of transistors and interconnects at the first side of the substrate, the structure including bond pad regions;
  applying a protective security covering; and
  patterning the protective security covering from the first side so as to expose the bond pad regions.

Security issues are becoming increasingly important aspects in semiconductor design and deployment particularly as the amount and range of potentially sensitive commercial and/or personal information that can be stored by, and transferred between electronic devices increases. Smart cards comprise one such form of electronic device in which it is essential to attempt to protect against invasive procedures such as attempted tampering with the integrity of the integrated circuit device, and procedures involving reverse engineering and exposure to radiation.

Security coatings for integrated circuit devices have been used in an attempt to improve the physical integrity of, for example, integrated circuit devices found on smart cards, by seeking to restrict the manner in which information held by the integrated circuit device can be accessed or modified.

One such level of protection designed by Schlumberger is referred to as Sishell. The process steps adopted by Schlumberger in the provision of its Sishell protection process requires the processing of the active devices, i.e. the integrated circuits within the smart card, to completion in a manner such that a passivation layer is located as required and the required bond pads are opened through the passivation layer. A layer of bare silicon is then glued over the upper surface of the integrated circuit and the silicon layer is provided with apertures, which are located so as to correspond with the locations where the bond pad openings within the integrated circuit are found. The stack comprising the integrated circuit, glue layer and silicon layer is then thinned by processing of the undersurface of the silicon substrate of the integrated circuit so as to achieve a required total thickness. In this manner, the integrated circuit side of the stack also becomes very sensitive and prone to damage and breakage if an attempt is made to lift off the silicon layer from above the passivation layer by mechanical means. However, insofar as the protective silicon cover layer is etched and patterned with regard, in particular, to the bond pad openings, such layer is disadvantageously prone to becoming etched and removed and this limits its integrity of security. Also the sensitivity to breakage of the integrated circuit can readily be overcome by fixing the integrated circuit to, for example, a sapphire substrate. Also, the stack structure formed is not sufficiently dense so as to prevent damage through infrared radiation and, somewhat further disadvantageously, silicon generally exhibits a transparency to infrared radiation, so that the underlying structures can then be observed.

Known process of this type are therefore disadvantageous in that the semiconductor device formed is provided with a security coating that only enhances the security of the device to a disadvantageously limited degree.

It is therefore a first object of the invention to provide a semiconductor device of the type mentioned in the opening paragraph which has a substantially enhanced security.

It is a second object to provide a carrier with the semiconductor device of the invention.

It is a third object of the invention to provide a method of manufacturing a semiconductor device of the kind mentioned in the opening paragraph, which exhibits an advantage over known such methods.

The first object is realized in that the protective security covering comprises a substantially non-transparent and substantially chemically inert security coating, and that the bond pad regions are accessible from the second side of the substrate.

As there is no need in the device of the invention to etch or pattern the protective security covering for bond pad access, it is possible to employ one, or a combination of, near chemically inert material layers in the security covering. Therewith it becomes almost impossible to polish the security covering, which greatly enhances the protection offered.

Although it might appear at first sight that the semiconductor device of the invention is at its second side open to probing and to detect any structures, this is not true or the problem can be solved. First of all, the bond pads can be protected by antiprobing means. This is not different from the prior art situation. Such antiprobing means can be of a software nature, a hardware nature or a combined hardware/software nature. For example, it can be prescribed that a signal should have a specific pattern and alternatively is directly connected to a ground plane.

The bond pad regions can be accessible to the second side of the substrate in various manners. It is preferably that the substrate is thinned and locally etched. This option is very suitable for silicon substrates. After the etching of the substrate bumps can be provided at the bond pad regions. Alternatively, the etched windows can be filled with metal, for example by electroplating.

In the preferred case that the substrate is a silicon substrate, the substrate with its dense packing of transistors offers a security in itself. The packing is here at its most dense in view of the transistors, preferably field-effect transistors, and contact plugs found therein. Any attempt to reach such structures will immediately result in damage to the junctions and to any thin gate oxides such that the integrated circuit device will not then function. In addition, it is almost impossible in practice to successfully probe sub-half-micron devices. Besides, in order to modify the pattern and data implemented in a semiconductor device, it are not only the individual transistors and other semiconductor elements that are vulnerable to attack, but also the circuit as implemented in the interconnect pattern. The dense packing of transistors effectively shields this circuit from the second side.

Nevertheless, a security layer can be provided at the second side of the substrate, which security layer leaves exposed the bond pad regions or any metallisation for access thereto. This option can be used with silicon or other semiconductor substrates. It is however in particular preferred in the case that the transistors are of the thin-film type that are present on an insulating substrate. Such a structure will have the advantage of flexibility, and is therefore very suitable for integration in flexible carriers, such as banknotes, other security papers, labels and tags. Further on, in the case of an insulating substrate with thin film transistors, the insulating substrate can be or contain a security layer or could be replaced by a security layer after processing if so desired.

In general, the protective security covering will contain a passivation layer to protect the underlying structure from any disadvantageous or contaminating influences of the security coating. It is further on preferred that an adhesion layer is present between the passivation layer and the security coating. A preferred example of such passivation layer is a layer of TiO2, which is chemically inert, closed and non-porous.

The security coating can contain a layer with a matrix of aluminummetaphosphate. Such a layer that is generally filled with particles such as TiN and TiO2 has as advantages of being chemically inert, non-transparent to radiation, relatively hard and brittle, and difficult to polish. It is preferably made from a precursor material, such as Al(H2PO3), or monoaluminumphosphate. This material is converted to aluminummetaphosphate in an anneal.

Alternatively or in addition thereto, the security coating is formed of multiple alternate layers, which alternate layers are sensitive to different etchants. Particularly preferred is a combination of alternate W and Al containing layers. The combination of such metals such as those defined proves to be particularly difficult to etch and polish, particularly by chemical mechanical means. This arises since Al does not etch in W etchants and vice versa. Also, when considering polishing such a structure, it will be necessary to change from one polishing pad to another every time each of the different layers is expected at the surface otherwise integration of the respective polishing pads is likely to become compromised and the pad damaged. However it should be appreciated that the basis of such a layer structure is W and then any metal that adheres to W and does not etch in H2O2/NH4OH or fluorine-containing plasma. The use of Al containing layers is particularly advantageous in allowing for ready handling and processing of the semiconductor device in an efficient manner.

In general, it will be understood that the security is most enhanced therewith that the security coating is unpatterned. However, there may be applications in which it is preferred to have patterning at both the first and the second side. Such an application arises for example with devices, that are capacitively coupled to an antenna structure that is present in the carrier, which is disclosed in the non-prepublished application with number EP00203298.5. In this case the capacitor electrodes can be provided on the first side and on the second side of the integrated circuit, whereas there is nevertheless an adequate security protection through the security coatings. A suitable security coating that can be patterned, is for example based on a matrix of monoaluminumphosphate. Patterning thereof may be done with a lift-off process.

The second object of a carrier with improved security is achieved in that the carrier comprises the semiconductor device of the invention. The carrier can be a smartcard, but may further be a tag, a label, a security paper including a banknote or even a record carrier such as an optical disc. As stated above, the record carrier may contain an antenna structure that is capacitively or with contact coupled to the semiconductor device.

The third object of an improved method of manufacturing a semiconductor device provided with a substrate with a first and second side is realized in that it comprises the steps of:

providing a structure of transistors and interconnects at the first side of the substrate, the structure including bond pad regions that are defined at an interface with the substrate;

applying a protective security covering including at least a substantially non-transparent and substantially chemically inert security coating;

patterning the substrate from the second side so as to expose the bond pad regions.

Processing the semiconductor device structure in this manner proves particularly advantageous in that, since the silicon substrate is effectively etched from underneath, there is no need to etch or pattern the protective coating for bond pad access and so it then proves possible to employ one, or a combination of, near chemically inert material layers for the security coatings, for bond pad access, since they do not subsequently have to be patterned. Such a requirement for patterning in the prior-art is disadvantageous.

Preferably, the substrate is a silicon substrate that is first thinned, for example by grinding or chemical-mechanical polishing and then locally etched. Etching means include KOH.

In a most preferred embodiment, a second substrate is provided on the protective security covering and attached to it by means of glue. Such a technique is also known as substrate transfer, and is per se known, for example of U.S. Pat. No. 5,689,138. The second substrate may contain any material, and is preferably providing mechanical support for the structure. Suitable materials include glass, aluminumoxide, silicon, epoxy, and the like. Preferably the glue layer has a thickness of some micrometers wherewith any unequalness in the surface of the protective security covering is overcome. Alternatively, an additional planarizing layer may be provided on top of the security covering.

The invention is described further hereinafter, by way of example only, with reference to the accompanying drawings in which FIGS. 1–8 comprise cross-sectional illustrations of the formation of a semiconductor device with a protective security covering formed thereon. Same reference numbers refer to like elements in the drawings. The drawings are diagrammatic and not on scale.

Turning now to the drawings, FIG. 1 illustrate an initial silicon substrate 10 with a first side 1 and a second side 2. The substrate 10 comprises a completed integrated circuit wafer structure including a passivation layer 12 in which projected bond pad regions 14. For reasons of clarity any interconnect layers that are present on the substrate 10 have been omitted in the drawings. It is however to be understood, that the bond pad regions 14 are present at the interface with the silicon substrate 10, or such that they can be exposed from the second side 2 of the substrate 10. This is contarily to the location of the bond pad regions in the prior art, wherein they were present in the top of the interconnect structure, and before being exposed, only being covered by the passivation layer 12. As will be understood by any skilled person, the bond pad regions are such defined, that there is no overlap with the transistors on perpendicular projection of the bond pad regions on the substrate.

In accordance with one particular aspect of the present invention, a plurality of security coatings 16 is deposited upon the passivation layer 12, the process of the present invention being such that there is no need to etch nor pattern the security coatings 16 and there is no need at this stage for the bond pad regions 14 to be opened. The passivation layer 12 may be omitted, but is preferably present. The plurality of security coatings forms the protective security covering.

With regard to FIG. 2, the security coatings 16 in the illustrated example comprises a TiO2 layer 18, a coating layer 20 based on monoAluminiumPhosphate (MAP) filled with particles of TiO2 and/or TiN, and subsequently a multi alternating layer structure 22 formed of Al and W layers respectively.

Figure 2:
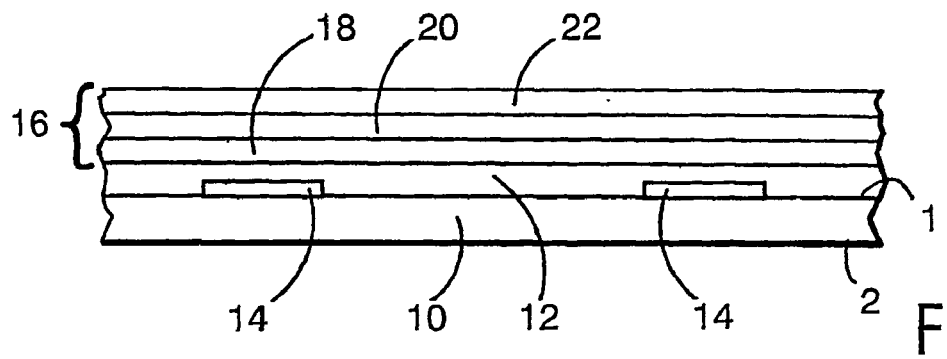
Figure 3:
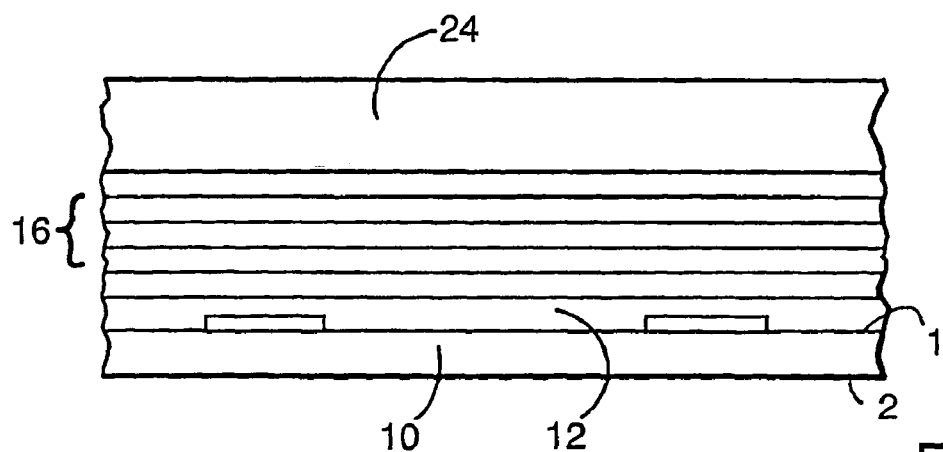

Subsequent to the coating of the substrate passivation layer structure as illustrated in FIG. 2, a substrate 24, which can be in the form of a silicon wafer substrate or a glass substrate such as AF45 is attached by means of a layer of glue 26 to the upper surface of the protective coatings 16, and as shown in FIG. 3.

Figure 4:
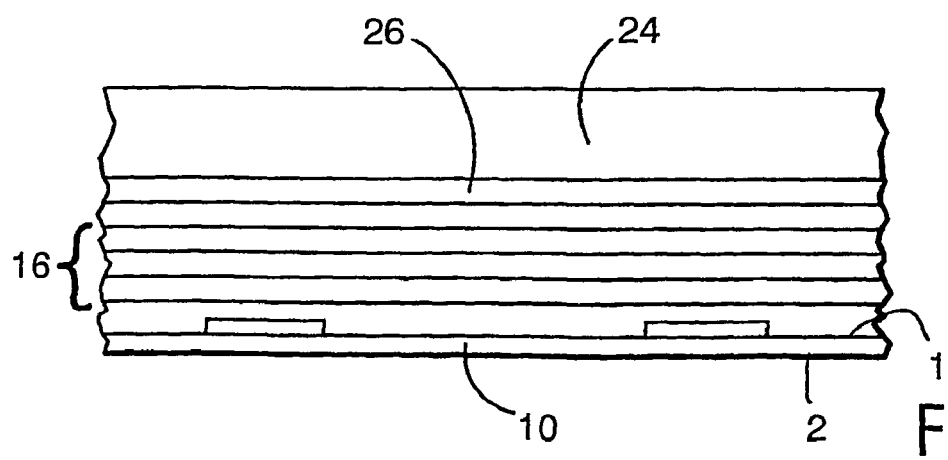

As illustrated in FIGS. 3 and 4, and by means of a substrate transfer process, the structure is then manipulated and processed in a manner so as to thin the silicon substrate 10 by action against the underside thereof.

Figure 5:
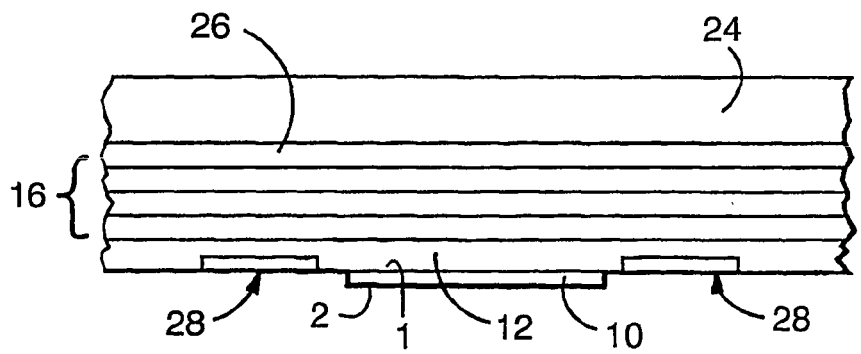

The underside of the structure illustrated in FIG. 4 is then manipulated and processed by means of, for example, a KOH etch at the regions 28 where the bond pads 14 are projected so as to arrive at the structure as illustrated in FIG. 5.

Figure 6:
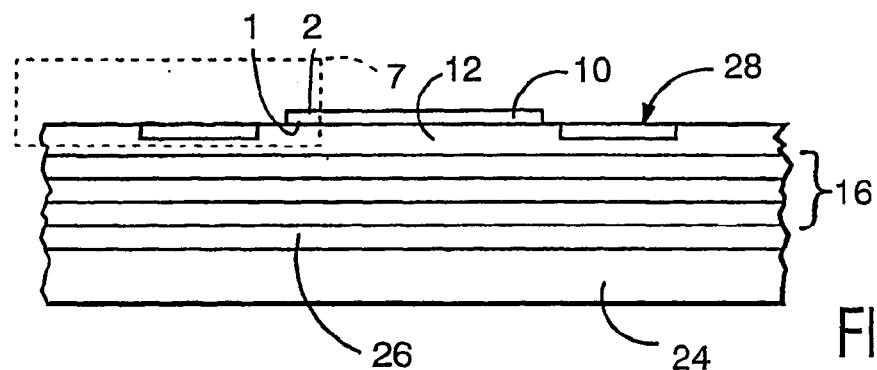
Figure 7:
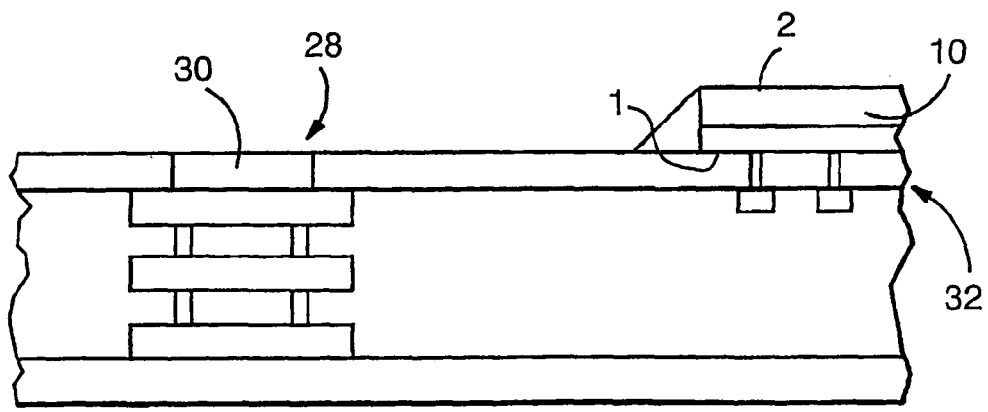

FIG. 6 illustrates the structure of FIG. 5 once inverted and the portion 7 illustrated in FIG. 6 is shown in greater detail in FIG. 7 which serves to illustrate a nitride layer 30 provided above the bond pad opening and also part of the semiconductor circuitry 32 provided under the thinned silicon substrate 10 which in accordance with the illustration of FIG. 7 is now oriented above the structure.

Figure 8:
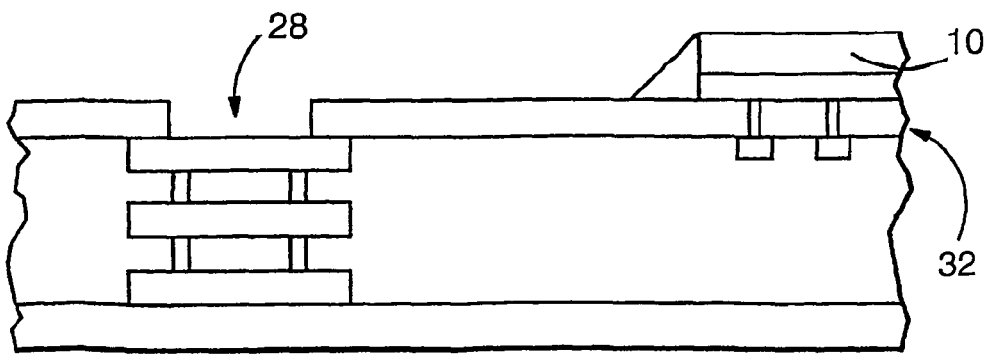

A selective etch is then conducted so as to arrive at the structure as illustrated in FIG. 8 which allows for subsequent testing and packaging of the integrated circuit device as required.

As will be appreciated particularly from FIGS. 6–8, the employment of a substrate transfer technique in accordance with this illustrated embodiment of the present invention proves particularly advantageous in that it allows for the ready processing of the structure in an manner so as to allow for the provision of security coatings formed of substantially inert materials. Also in providing for openings to the bond pad regions through the thinned semiconductor substrate, an appropriate degree of protection due to the density of device structures provided therein is provided and which serves to prevent access to the underside of the structure without fatal damage to the device.

The invention claimed is:

1. A semiconductor device comprising a substrate with a first and an opposed second side, at which first side a plurality of transistors and interconnects is present, which are covered by a protective security covering, which device is further provided with bond pad regions, characterized in that the protective security covering comprises a substantially non-transparent and substantially chemically inert security coating, the security coating including at least one layer of inorganic material, and the bond pad regions are accessible from the second side of the substrate, wherein the security coating comprises, a $TiO_2$ layer, a coating layer based on monoAlunuinumPhosphate (MAP) filled with particles of either TiN or $TiO_2$; and a multi alternating layer structure formed of Al and W layers, respectively.

2. The semiconductor device as recited in claim 1, characterized in that the bond pad regions are present on the first side of the substrate, and the substrate is a silicon substrate, that is patterned as required for access to the bond pad regions.

3. The semiconductor device as recited in claim 1, characterized in that a security layer is present at the second side of the substrate, which security layer leaves exposed the bond pad regions or any metallisation for access thereto.

4. The semiconductor device as recited in claim 1, characterized in that the bond pad regions are protected against probing with antiprobe means.

5. A carrier comprising a semiconductor device, according to claim 1.

6. The semiconductor device as recited in claim 1, wherein the security coating is is patterned.

7. The semiconductor device as recited in claim 6, wherein the security coating is patterned to provide capacitive coupling from the semiconductor device to an antenna structure in a carrier.

8. The semiconductor device as recited in claim 1, wherein the security coating is patterned to provide capacitive coupling from the semiconductor device to an antenna structure in a carrier.

9. A semiconductor device comprising a substrate with a first and an opposed second side, at which first side a plurality of transistors and interconnects is present, which are covered by a protective security covering, which device is further provided with bond pad regions, characterized in that the protective security covering comprises a substantially non-transparent and substantially chemically inert security coating, the security coating including at least one layer of inorganic material, and is formed of multiple alternate layers, which alternate layers are sensitive to different etchants and the bond pad regions are accessible from the second side of the substrate, wherein the security coating comprises, a $TiO_2$ layer, a coating layer based on monoAluminiumPhosphate (MAP) filled with particles of either TiN or $TiO_2$, and a multi alternating layer structure formed of Al and W layers, respectively.

* * * * *